United States Patent
Wildeson et al.

(10) Patent No.: US 11,211,527 B2
(45) Date of Patent: Dec. 28, 2021

(54) LIGHT EMITTING DIODE (LED) DEVICES WITH HIGH DENSITY TEXTURES

(71) Applicant: Lumileds LLC, San Jose, CA (US)

(72) Inventors: Isaac Wildeson, San Jose, CA (US); Toni Lopez, Aachen (DE); Robert Armitage, Los Altos, CA (US); Parijat Deb, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 48 days.

(21) Appl. No.: 16/721,285

(22) Filed: Dec. 19, 2019

(65) Prior Publication Data

US 2021/0193869 A1    Jun. 24, 2021

(51) Int. Cl.
*H01L 33/22* (2010.01)
*H01L 33/00* (2010.01)
*H01L 33/32* (2010.01)

(52) U.S. Cl.
CPC ............ *H01L 33/22* (2013.01); *H01L 33/007* (2013.01); *H01L 33/32* (2013.01)

(58) Field of Classification Search
None
See application file for complete search history.

(56) References Cited

U.S. PATENT DOCUMENTS

| | | |
|---|---|---|
| 5,283,447 A | 2/1994 | Olbright et al. |
| 5,413,967 A * | 5/1995 | Matsuda ........... H01L 21/02208 438/783 |
| 5,952,681 A | 9/1999 | Chen |
| 7,692,202 B2 | 4/2010 | Bensce |
| 8,022,421 B2 | 9/2011 | Hsueh et al. |
| 8,058,663 B2 | 11/2011 | Fan et al. |
| 8,114,691 B2 | 2/2012 | Lee et al. |
| 8,604,498 B2 | 12/2013 | Huang et al. |
| 8,654,802 B2 | 2/2014 | Kumei |
| 9,029,175 B2 | 5/2015 | Huang et al. |
| 9,130,353 B2 | 9/2015 | Lell et al. |
| 9,246,050 B2 | 1/2016 | Cha et al. |
| 9,419,031 B1 | 8/2016 | Or-Bach et al. |
| 9,537,050 B2 | 1/2017 | Gilet et al. |
| 9,876,141 B2 | 1/2018 | Lopez |
| 10,002,928 B1 | 6/2018 | Raring et al. |

(Continued)

FOREIGN PATENT DOCUMENTS

| CN | 107068811 A | 8/2017 |
|---|---|---|
| DE | 102010002966 A1 | 9/2011 |

(Continued)

OTHER PUBLICATIONS

Google translation of WO 2017/067333 (Year: 2017).*

(Continued)

*Primary Examiner* — Bradley Smith
(74) *Attorney, Agent, or Firm* — Servilla Whitney LLC

(57) ABSTRACT

Light emitting diode (LED) devices comprise: a patterned substrate comprising a substrate body, a plurality of integral features protruding from the substrate body, and a base surface defined by spaces between the plurality of integral features; a selective layer comprising a dielectric material located on the surfaces of the integral features, wherein there is an absence of the selective layer on the base surface; and a III-nitride layer comprising a III-nitride material on the selective layer and the base surface.

17 Claims, 8 Drawing Sheets

(56) References Cited

U.S. PATENT DOCUMENTS

| | | |
|---|---|---|
| 10,050,080 B2 | 8/2018 | Gilet et al. |
| 10,090,437 B2 | 10/2018 | Timmering et al. |
| 10,103,195 B2 | 10/2018 | Damilano et al. |
| 10,249,800 B1 | 4/2019 | Lamkin |
| 10,355,168 B2 | 7/2019 | Lopez |
| 2002/0187568 A1 | 12/2002 | Stockman |
| 2006/0060866 A1 | 3/2006 | Tezen |
| 2007/0158659 A1 | 7/2007 | Bensce |
| 2007/0170444 A1 | 7/2007 | Cao |
| 2008/0251799 A1 | 10/2008 | Kazuhiro |
| 2009/0078955 A1 | 3/2009 | Fan et al. |
| 2009/0090932 A1 | 4/2009 | Bour et al. |
| 2010/0117997 A1 | 5/2010 | Haase |
| 2011/0012109 A1* | 1/2011 | Kryliouk ............ H01L 21/02433 257/49 |
| 2011/0027925 A1 | 2/2011 | Mitsuhiro |
| 2011/0163223 A1 | 7/2011 | Guidash |
| 2011/0233575 A1 | 9/2011 | Huang et al. |
| 2011/0256648 A1 | 10/2011 | Kelley et al. |
| 2012/0135557 A1 | 5/2012 | Okuno |
| 2012/0276722 A1 | 11/2012 | Chyi et al. |
| 2013/0022063 A1 | 1/2013 | Masaya |
| 2013/0069191 A1 | 3/2013 | Or-Bach et al. |
| 2013/0193308 A1 | 8/2013 | Cellek et al. |
| 2013/0193448 A1 | 8/2013 | Chou et al. |
| 2013/0252361 A1 | 9/2013 | Li et al. |
| 2014/0065740 A1 | 3/2014 | Huang et al. |
| 2014/0191243 A1 | 7/2014 | Singh et al. |
| 2015/0024524 A1 | 1/2015 | Yao |
| 2015/0093121 A1 | 4/2015 | Manabu et al. |
| 2015/0115290 A1 | 4/2015 | Guenard |
| 2015/0270434 A1 | 9/2015 | Hertkorn et al. |
| 2016/0197151 A1 | 7/2016 | Han et al. |
| 2017/0025567 A1 | 1/2017 | Lu et al. |
| 2017/0098746 A1 | 4/2017 | Bergmann et al. |
| 2017/0181241 A1 | 6/2017 | Hoe |
| 2017/0213868 A1 | 7/2017 | Damilano et al. |
| 2017/0264080 A1 | 9/2017 | Lell et al. |
| 2017/0323788 A1 | 11/2017 | Ml et al. |
| 2017/0338373 A1 | 11/2017 | Wildeson et al. |
| 2018/0012929 A1 | 1/2018 | Lu et al. |
| 2018/0019359 A1 | 1/2018 | Kayes et al. |
| 2018/0104130 A1 | 4/2018 | Sampson et al. |
| 2018/0182919 A1* | 6/2018 | Okuno .................. H01L 33/20 |
| 2018/0269352 A1 | 9/2018 | Tian et al. |
| 2018/0269532 A1 | 9/2018 | Tian et al. |
| 2019/0006178 A1 | 1/2019 | Huang et al. |
| 2019/0006821 A1 | 1/2019 | Tang et al. |
| 2019/0052061 A1 | 2/2019 | Kondo |
| 2019/0074404 A1 | 3/2019 | Young et al. |
| 2019/0148586 A1 | 5/2019 | Zhang et al. |
| 2019/0198561 A1 | 6/2019 | Wildeson et al. |
| 2019/0198709 A1 | 6/2019 | Wildeson et al. |
| 2019/0229234 A1 | 7/2019 | Zou et al. |
| 2019/0279558 A1 | 9/2019 | Monestier et al. |
| 2020/0194549 A1 | 6/2020 | Dasgupta et al. |
| 2021/0118680 A1 | 4/2021 | Stoffels et al. |

FOREIGN PATENT DOCUMENTS

| | | |
|---|---|---|
| EP | 2743966 A1 | 6/2014 |
| JP | 2002324915 A | 11/2002 |
| JP | 2005236667 A | 9/2005 |
| JP | 6245319 B1 | 12/2017 |
| KR | 1020170129009 A | 11/2017 |
| WO | 2005073485 A2 | 8/2005 |
| WO | 2012077884 A1 | 6/2012 |
| WO | 2017067333 A1 | 4/2017 |

OTHER PUBLICATIONS

European Search Report dated Jun. 23, 2020, 10 pages.
"TracePro's accurate LED source modeling improves the performance of optical design simulations", Lambda Research Corporation, Technical Article, Mar. 2015, 13 pages.
Lu, Zongyuan , et al., "Precise optical modeling of blue light-emitting diodes by Monte Carlo ray-tracing", Optics Express, Apr. 26, 2010, vol. 18, No. 9, pp. 9398-9412.
Non-Final Office Action in U.S. Appl. No. 17/010,300, dated Feb. 19, 2021, 12 pages.
PCT International Search Report and Written Opinion in PCT/US2020/060961 dated Mar. 4, 2021, 11 pages.
Final Office Action in U.S. Appl. No. 16/228,311 dated Nov. 29, 2019, 14 pages.
"IEEE 802.15.7-2011—IEEE Standard for Local and Metropolitan Area Networks-Part 15.7: Short-Range Wireless Optical Communication Using Visible Light (2011)", pp. 1-150.
Continuation of "IEEE 802.15.7-2011—IEEE Standard for Local and Metropolitan Area Networks-Part 15.7: Short-Range Wireless Optical Communication Using Visible Light (2011)", pp. 151-309.
"Luxeon FlipChip Royal Blue", High current density Chip Scale Package (CSP) LED, Product Brief, Jul. 22, 2016, 2 pages.
Chang , et al., "Cascaded GaN Light-Emitting Diodes with Hybrid Tunnel Junction Layers", IEEE Journal of Quantum Electronics, vol. 51, No. 8, pp. 1-5, Art No. 3300505 (Aug. 2015).
El-Ghoroury , "Growth of monolithic full-color GaN-based LED with intermediate carrier blocking layers", AIP Advances 6, 075316 (2016).
Okumura , et al., "Backward diodes using heavily Mg-doped GaN growth by ammonia molecular-beam epitaxy", Appl. Phys. Lett. 108, 072102 (2016).
Schubert , "Interband tunnel junctions for wurtzite III-nitride semiconductors based on heterointerface polarization charages", Phys. Rev. B 81, 035303 (2010).
Non-Final Office Action in U.S. Appl. No. 16/228,211, dated Apr. 15, 2020, 17 pages.
Non-Final Office Action in U.S. Appl. No. 16/228,311, dated Apr. 17, 2020, 12 pages.
"European Search Report dated Sep. 7, 2020,8 pages".
"Final Office Action in U.S. Appl. No. 16/721,285 dated Jun. 24, 2021, 12 pages".
"Non-Final Office Action in U.S. Appl. No. 16/721,285 dated Aug. 18, 2021, 11 pages".
"Non-Final Office Action in U.S. Appl. No. 16/721,285, dated Apr. 14, 2021, 12 pages".
"Non-Final Office Action in U.S. Appl. No. 16/721,386 dated Jul. 14, 2021, 11 pages".

* cited by examiner

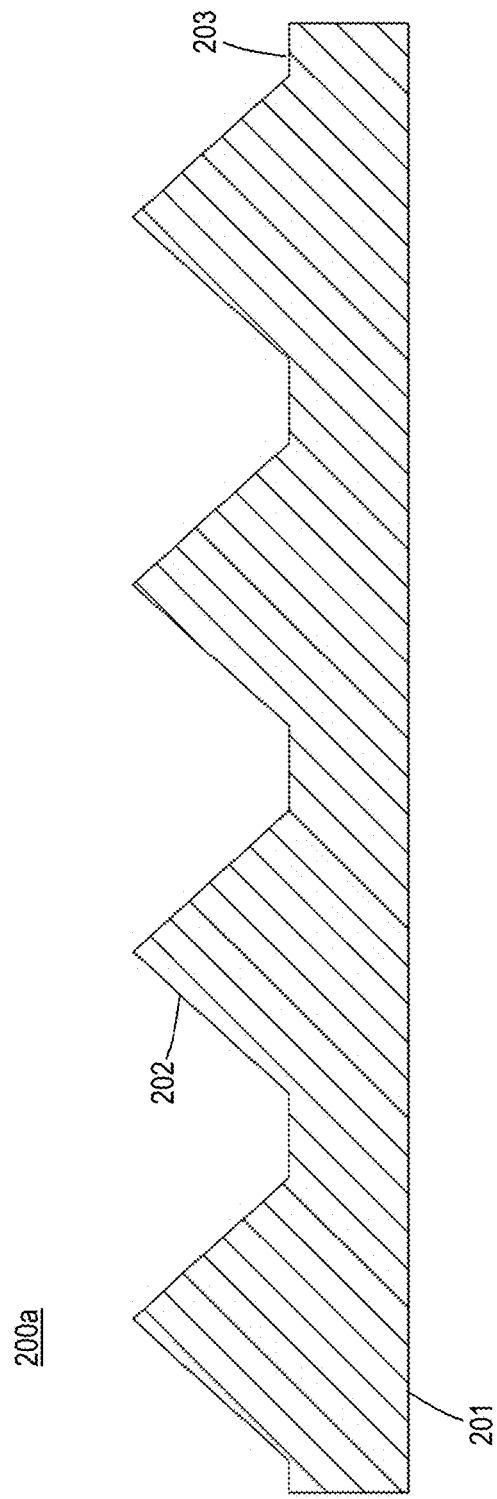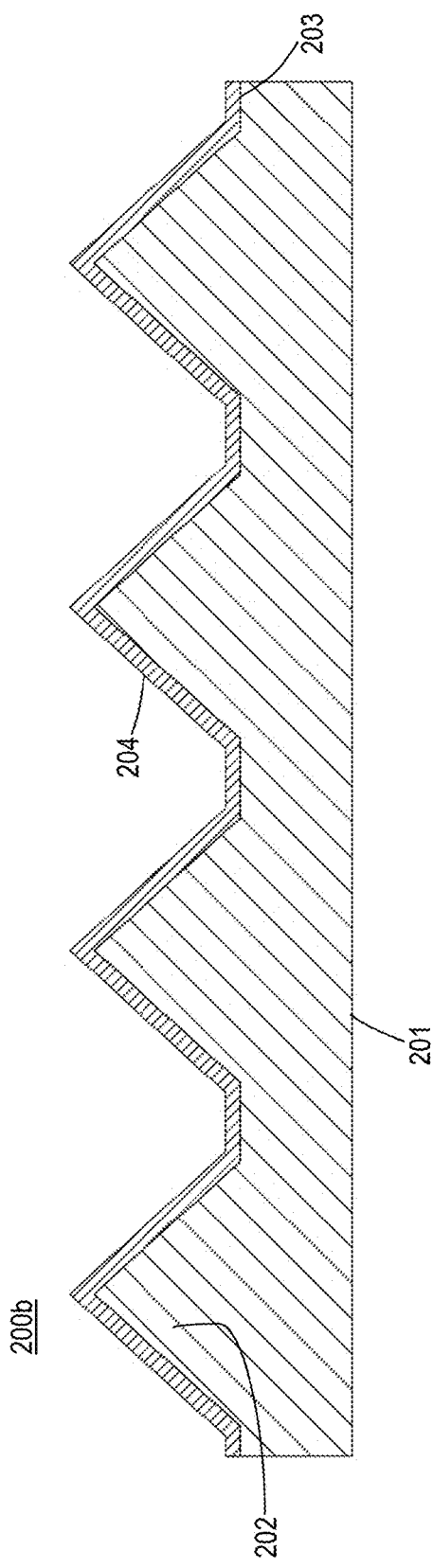

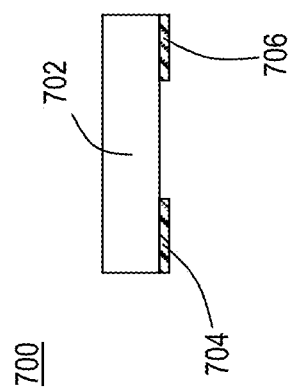

LIGHT EMITTING DIODE (LED) DEVICES WITH HIGH DENSITY TEXTURES

TECHNICAL FIELD

Embodiments of the disclosure generally relate to light emitting diode (LED) devices and methods for manufacturing the same. More particularly, embodiments of the disclosure are directed to LED devices with high density textures and methods for selectively depositing a dielectric material onto a patterned substrate and epitaxially growing a III-nitride layer therein.

BACKGROUND

A light emitting diode (LED) is a semiconductor light source that emits visible light when current flows through it. LEDs combine a P-type semiconductor with an N-type semiconductor. LEDs commonly use a III-group compound semiconductor. A III-group compound semiconductor provides stable operation at a higher temperature than devices that use other semiconductors. The III-group compound is typically formed on a substrate formed of sapphire or silicon carbide (SiC).

Direct light emitters based on patterned sapphire substrate (PSS) LEDs suffer from low luminance levels and broad angular emission patterns due to their inherent geometrical features (light is emitted from 5 sides of the chip, including the four side surfaces). These limitations can be mitigated by the use of side-coating materials to prevent light escaping from the sides of the chip and enforce light emission only from the top substrate surface. Side coating materials, however, significantly penalize light extraction efficiency (ExE), particularly in domeless emitters, as the side-coat increases light trapping in the die and it itself is not 100% reflective.

When a III-nitride material, such as GaN, is epitaxially-grown on a substrate, for example a sapphire substrate (PSS), of a light emitting diode (LED) device most of the emitted photons are trapped inside the device due to a relatively small critical angle (~45 deg.) for total internal reflection at the GaN/sapphire interface. Etching a pattern of 3D features into the sapphire substrate before growing the epitaxy can increase LED efficiency by allowing photons with a wider range of incident angles to pass through the patterned GaN/sapphire interface as compared to the non-patterned interface. Such patterned sapphire substrates (PSS) are widely used in industry but the maximum efficiency of state-of-the art PSS-based LEDs remains limited by inherent trade-offs in the optimization of the pattern geometry. On the one hand, the 3D features should be packed as closely together as possible to maximize light out-coupling from GaN into sapphire, while on the other hand it becomes difficult to grow a continuous GaN layer with a smooth surface on a PSS if the 3D features are packed too closely together. Moreover, relatively large distances between pattern features can limit diffraction and hence light out-coupling efficiency. Other limitations of PSS include broad angular emission and limited reflectance seen from the sapphire side. For example, 3D features produce side emission, which limits brightness and the efficiency of an optical system incorporating the LED as its light source; and back reflected light from a phosphor layer coated onto the sapphire will be transmitted into the GaN epi and back mirror and hence be partly absorbed.

There is a need for light emitting diode (LED) devices with high density textures and for methods of making the same.

SUMMARY

Devices herein are light emitting diode (LED) devices with high density textures.

One or more aspects of the disclosure are directed to light emitting diode (LED) devices. In an embodiment, a light emitting diode (LED) device comprising: a patterned substrate comprising a substrate body, a plurality of integral features protruding from the substrate body, and a base surface defined by spaces between the plurality of integral features; a selective layer comprising a dielectric material located on the surfaces of the integral features, wherein there is an absence of the selective layer on the base surface; and a III-nitride layer comprising a III-nitride material on the selective layer and the base surface.

The selective layer may be located on all portions of surfaces of the integral features. In one or more embodiments, the selective layer is located on all portions of surfaces of the integral features.

The absence of the selective layer may be for all portions of the base surface. In one or more embodiments, the selective layer is for all portions of the base surface.

The III-nitride material may comprise: gallium (Ga), aluminum (Al), indium (In), or combinations thereof. In one or more embodiments, the III-nitride material comprises: gallium (Ga), aluminum (Al), indium (In), or combinations thereof.

The dielectric material may comprise a low refractive index material having a refractive index in a range of about 1.2 to about 2. In one or more embodiments, the dielectric material comprises a low refractive index material having a refractive index in a range of about 1.2 to about 2.

The dielectric material may comprise: silicon dioxide, ($SiO_2$), silicon nitride ($Si_3N_4$), or combinations thereof. In one or more embodiments, the dielectric material comprises: silicon dioxide, ($SiO_2$), silicon nitride ($Si_3N_4$), or combinations thereof.

The selective layer may have a thickness in a range of 20 nm to 400 nm. In one or more embodiments, the selective layer has a thickness in a range of 20 nm to 400 nm.

The LED device may further comprise a conformal nucleation layer comprising a nucleation material on the surfaces of the integral features and on the base surface, wherein the nucleation layer on the surfaces of the integral features is below the selective layer. In one or more embodiments, the LED device further comprises a conformal nucleation layer comprising a nucleation material on the surfaces of the integral features and on the base surface, wherein the nucleation layer on the surfaces of the integral features is below the selective layer.

The nucleation material may comprise: aluminium nitride (AlN), gallium nitride (GaN), aluminum gallium nitride (AlGaN), zinc oxide (ZnO), or combinations thereof. In one or more embodiments, the nucleation material comprises: aluminium nitride (AlN), gallium nitride (GaN), aluminum gallium nitride (AlGaN), zinc oxide (ZnO), or combinations thereof.

The plurality of integral features may have a shape selected from: a hemispherical shape, a triangular pyramidal shape, a quadrangular pyramidal shape, a hexagonal pyramid shape, a conical shape, a semi-spherical shape, and a cut-spherical shape. In one or more embodiments, the plurality of integral features has a shape selected from: a hemispherical shape, a triangular pyramidal shape, a quadrangular pyramidal shape, a hexagonal pyramid shape, a conical shape, a semi-spherical shape, and a cut-spherical shape.

The substrate may comprise a material of: sapphire, spinel, zinc oxide (ZnO), magnesium oxide (MgO), or combinations thereof. In one or more embodiments, the substrate comprises a material of: sapphire, spinel, zinc oxide (ZnO), magnesium oxide (MgO), or combinations thereof. The substrate may be planar. In one or more embodiments, the substrate is planar.

Another embodiment provides a light emitting diode (LED) device comprising: a patterned sapphire substrate comprising a substrate body, a plurality of integral features protruding from the substrate body, and a base surface defined by spaces between the plurality of integral features; a conformal nucleation layer on the surfaces of the integral features and on the base surface; a selective layer on the conformal nucleation layer, the selective layer comprising a dielectric material of silicon dioxide located above the integral features, wherein there is an absence of the selective layer above the base surface, the selective layer having a thickness in a range of 20 nm to 200 nm; and a III-nitride layer comprising a gallium nitride (GaN) material on the selective layer and the base surface.

The selective layer may be located on all portions of surfaces of the integral features. In one or more embodiments, the selective layer is located on all portions of surfaces of the integral features.

The absence of the selective layer may be for all portions of the base surface. In one or more embodiments, the absence of the selective layer is for all portions of the base surface.

Additional embodiments of the disclosure are directed to methods of manufacturing light emitting diode (LED) devices. In an embodiment, a method of manufacturing comprises: creating a selective layer comprising a dielectric material on a patterned substrate that comprises: a substrate body, a plurality of integral features protruding from the substrate body, and a base surface defined by spaces between the plurality of integral features, wherein the selective layer is located on surfaces of the integral features, wherein there is an absence of the selective layer on the base surface thereby making a selective layer-coated substrate; and epitaxially growing a III-nitride layer on the selective layer-coated substrate.

The selective layer may be created by depositing the dielectric material onto the patterned substrate by a directional deposition process that is selective to deposition on the surfaces of the plurality of integral features; and thereafter etching to remove any dielectric material from the base surface. In one or more embodiments, the selective layer is created by depositing the dielectric material onto the patterned substrate by a directional deposition process that is selective to deposition on the surfaces of the plurality of integral features; and thereafter etching to remove any dielectric material from the base surface.

The selective layer is created by depositing the dielectric material onto the patterned substrate by: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), or combinations thereof; and thereafter selectively etching the dielectric material from the base surface preferentially over the surfaces of the integral features. In one or more embodiments, the selective layer is created by depositing the dielectric material onto the patterned substrate by: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), or combinations thereof; and thereafter selectively etching the dielectric material from the base surface preferentially over the surfaces of the integral features.

The selective layer may be on all portions of surfaces of the integral features. In one or more embodiments, the selective layer is on all portions of surfaces of the integral features.

The absence of the selective layer may be for all portions of the base surface. In one or more embodiments, the absence of the selective layer is for all portions of the base surface.

Depositing a nucleation layer onto the patterned substrate may occur before depositing the dielectric material. In one or more embodiments, depositing a nucleation layer onto the patterned substrate occurs before depositing the dielectric material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIGS. 2A-2E illustrate cross-sectional views of a light emitting diode (LED) device at different stages of manufacture according to one or more embodiments;

FIG. 6 illustrates a cross-section view of an exemplary LED package according to one or more embodiments.

DETAILED DESCRIPTION

Figure 1:
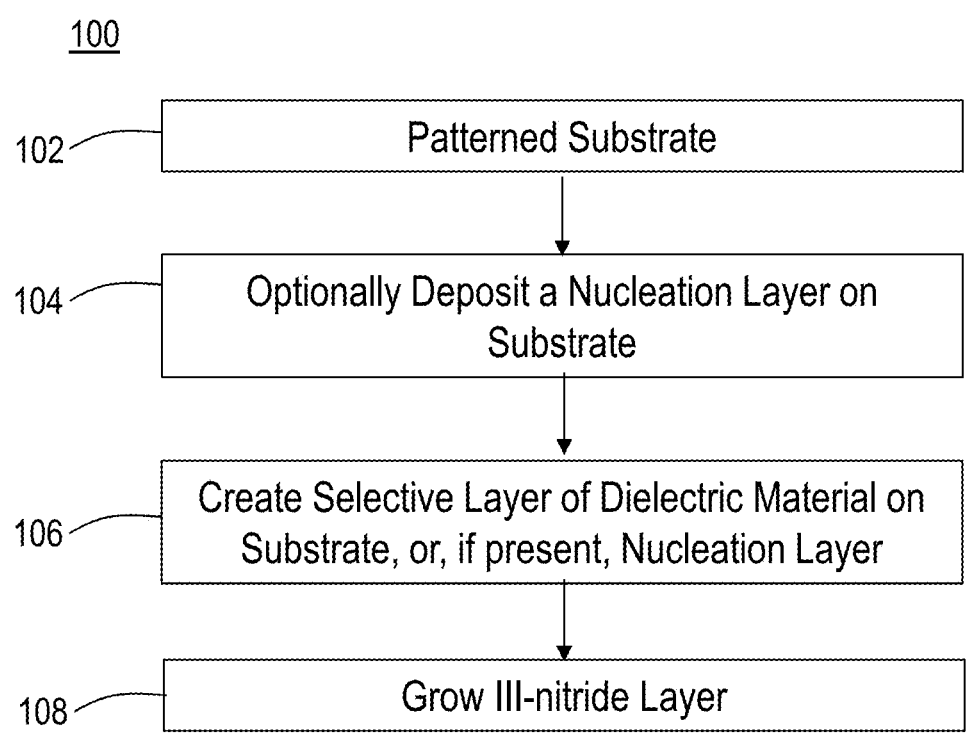
FIG. 1 illustrates a process flow diagram for a method of manufacture according to one or more embodiments.
Figure 2C:
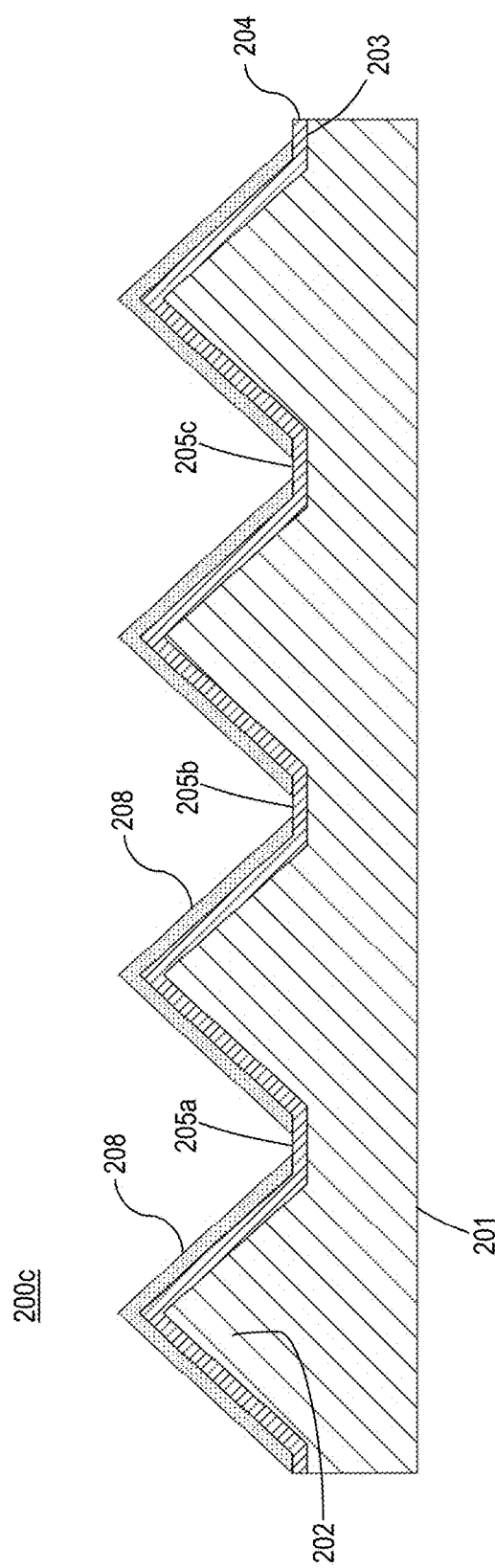
Figure 2D:
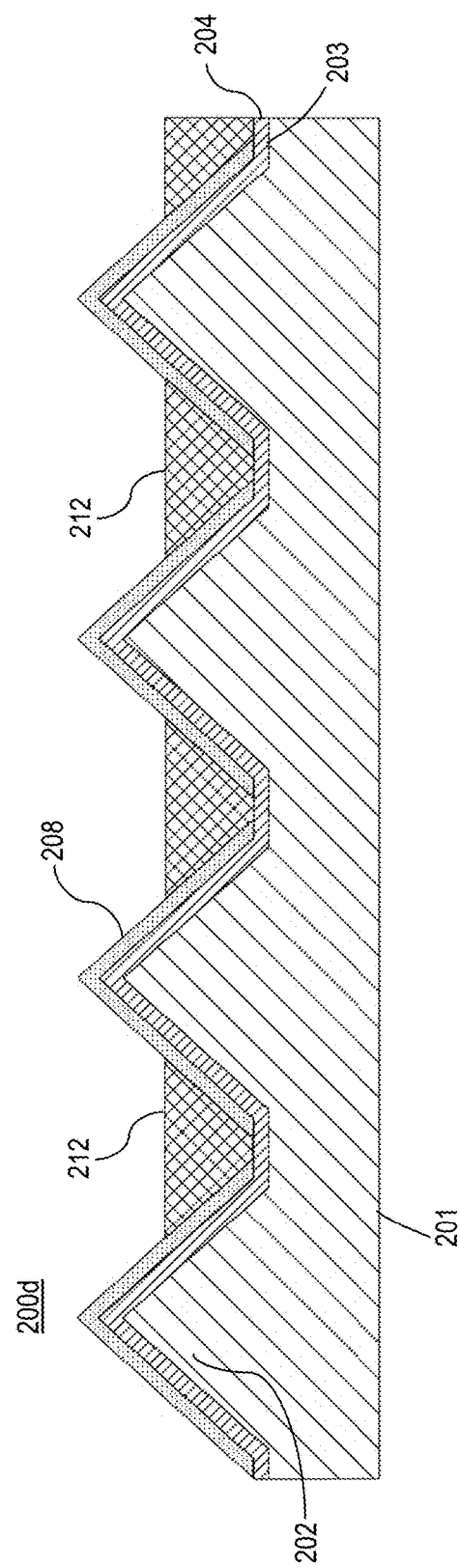
Figure 2E:
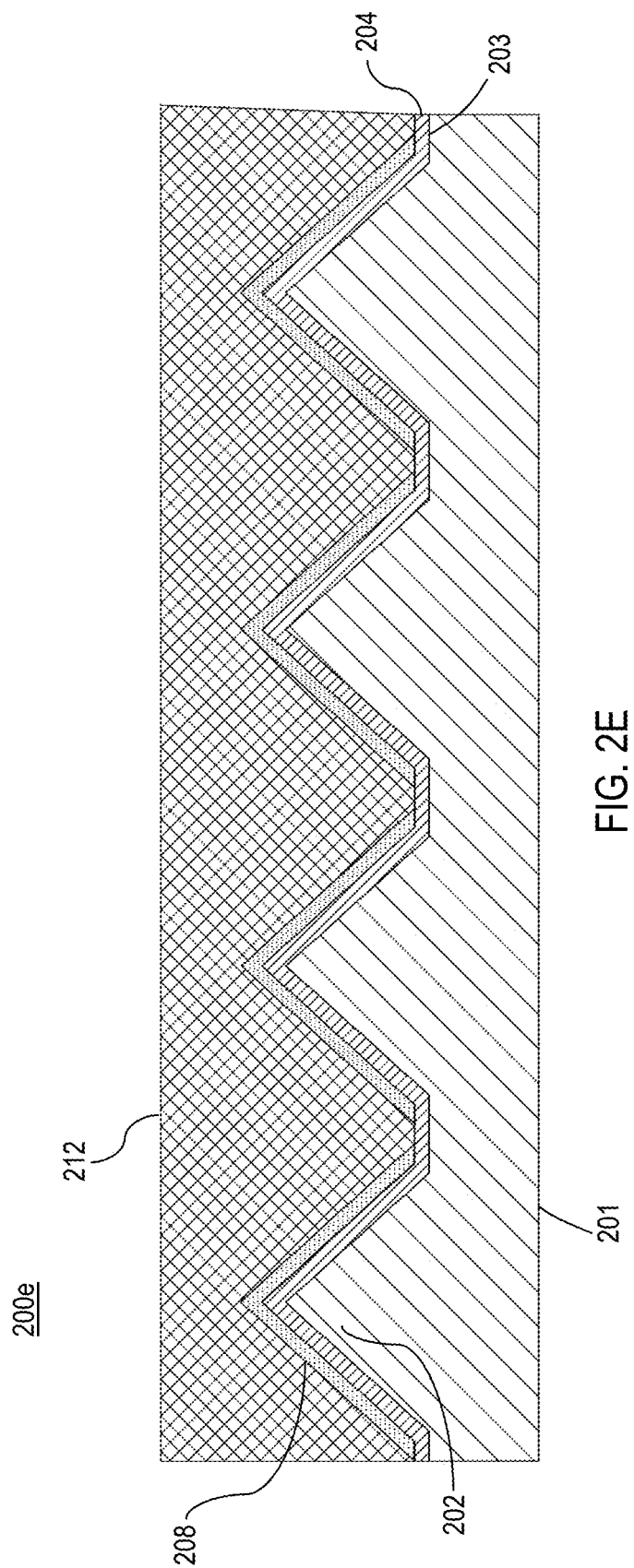

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN and alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Method of depositing thin films include but are not limited to: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof.

As used herein in one or more embodiments, "sputter deposition" refers to a physical vapor deposition (PVD) method of thin film deposition by sputtering. In sputter deposition, a material, e.g. a III-nitride, is ejected from a target that is a source onto a substrate. The technique is based on ion bombardment of a source material, the target. Ion bombardment results in a vapor due to a purely physical process, i.e., the sputtering of the target material.

As used according to some embodiments herein, "atomic layer deposition" (ALD) or "cyclical deposition" refers to a vapor phase technique used to deposit thin films on a substrate surface. The process of ALD involves the surface of a substrate, or a portion of substrate, being exposed to alternating precursors, i.e. two or more reactive compounds, to deposit a layer of material on the substrate surface. When the substrate is exposed to the alternating precursors, the precursors are introduced sequentially or simultaneously. The precursors are introduced into a reaction zone of a processing chamber, and the substrate, or portion of the substrate, is exposed separately to the precursors.

As used herein according to some embodiments, "chemical vapor deposition" refers to a process in which films of materials are deposited from the vapor phase by decomposition of chemicals on a substrate surface. In CVD, a substrate surface is exposed to precursors and/or co-reagents simultaneous or substantially simultaneously. As used herein, "substantially simultaneously" refers to either co-flow or where there is overlap for a majority of exposures of the precursors.

As used herein according to some embodiments, "plasma enhanced atomic layer deposition (PEALD)" refers to a technique for depositing thin films on a substrate. In some examples of PEALD processes relative to thermal ALD processes, a material may be formed from the same chemical precursors, but at a higher deposition rate and a lower temperature. A PEALD process, in general, a reactant gas and a reactant plasma are sequentially introduced into a process chamber having a substrate in the chamber. The first reactant gas is pulsed in the process chamber and is adsorbed onto the substrate surface. Thereafter, the reactant plasma is pulsed into the process chamber and reacts with the first reactant gas to form a deposition material, e.g. a thin film on a substrate. Similarly to a thermal ALD process, a purge step may be conducted between the delivery of each of the reactants.

As used herein according to one or more embodiments, "plasma enhanced chemical vapor deposition (PECVD)" refers to a technique for depositing thin films on a substrate. In a PECVD process, a source material, which is in gas or liquid phase, such as a gas-phase III-nitride material or a vapor of a liquid-phase III-nitride material that have been entrained in a carrier gas, is introduced into a PECVD chamber. A plasma-initiated gas is also introduced into the chamber. The creation of plasma in the chamber creates excited radicals. The excited radicals are chemically bound to the surface of a substrate positioned in the chamber, forming the desired film thereon.

One or more embodiments of the disclosure advantageously provide methods to process and grow a III-nitride layer comprising a III-nitride material, for example, GaN, epitaxy on patterned substrates, for example patterned sapphire substrates (PSS), which makes possible the realization of smooth, device-quality III-nitride layers, for example GaN layers, on PSS with much denser patterns than has been previously possible. By using selectively forming a layer of dielectric material on inclined planes of pattern features, it is possible to avoid the problems with nucleation and coalescence which typically cause the GaN epitaxy to fail when the patterned features are packed too closely together. Optionally, a pre-deposited nucleation layer is deposited on the PSS prior to the selective layer of dielectric material. Light out-coupling and package efficiency benefits specific to the use of a low refractive index coating exist for a wide range of pattern feature geometries including current state-of-the-art patterns and are not limited to very dense packing geometries.

The nucleation rate of GaN on amorphous dielectric materials such as $SiO_2$ and $Si_3N_4$ is much lower than the nucleation rate on sapphire, AlN, or GaN. Without intended to be bound by theory, it is thought that a so-called masking effect of a selective layer of dielectric material that avoids problematic nucleation behavior and makes possible growth of smooth and cleanly coalesced GaN layers on PSS with denser patterns. The increased pattern density made possible by the present disclosure can maximize diffraction effects so that the transmission of oblique incident light from GaN into sapphire can be increased, thereby producing a net light extraction gain. Furthermore, the selective layer of dielectric material can minimize absorption losses for light that gets reflected from the phosphor layer of phosphor-converted LEDs back into the die. The selective layer of dielectric material gives a further advantage in that the angular radiation patterns produced by denser pattern features are narrower improving brightness and avoiding side emission into regions where the radiation will potentially be absorbed or simply not used. The relatively broadness of the radiation pattern produced by state-of-the art PSS-based LEDs is problematic for some applications but can be improved with the present disclosure.

In implementations where the selective dielectric coating is chosen to be a low refractive index material such as $SiO_2$, some additional benefits are possible as follows. Low refractive index patterned features effectively allow increasing forward gain, which in turn, improves light out-coupling. A thinner layer coating may enhance this effect. Increased die reflectance: the low refractive index layer coating reduces the transmission of light from sapphire into GaN, thereby improving the package efficiency in phosphor converted LEDs as a consequence of an effective increase of the die reflectance 'seen' by the phosphor layer. This reflectivity gain is promoted by the principle of Fresnel refraction at an interface between two media. Reflection by refraction increases with the index contrast at the layer interface, particularly when the refractive index (RI) of the source medium is higher than that of the transmitted medium. In this case, materials whose RI is significantly lower than that of sapphire are advantageous.

The use of a selective layer of dielectric material made from a low refractive index material has further broadly applicable advantages independent of growth and feature packing considerations. There are light out-coupling and package efficiency benefits specific to the use of a low refractive index coating for a wide range of pattern feature geometries including current state-of-the-art patterns and are not limited to very dense packing geometries.

FIG. 1 illustrates a process flow diagram for an exemplary method of manufacturing 100 according to one or more embodiments. FIGS. 2A-2E illustrate cross-sectional views of a light emitting diode (LED) device 200 at different stages of manufacture according to one or more embodiments.

Referring to FIGS. 1, 2A-2E, and FIG. 3, the method of manufacturing 100 begins at operation 102 with a patterned substrate 200a, which may be, for example, a patterned sapphire substrate. The substrate may be planar. The patterned substrate may be created and/or prepared to comprise: a substrate body 201, a plurality of integral features 202 protruding from the substrate body 201, and a base surface 203 defined by spaces between the plurality of integral features 201. For example, the patterned substrate 200a may be created by etching, by wet and/or dry methods, an array pattern of holes through a mask into a substrate wafer. The array pattern has a pitch designed to deliver a desired density of integral features.

The patterned substrates may be designed to deliver a desired surface area ratio of the base surface versus the plurality of integral features. The devices herein may have an increased density of integral features relative to currently available devices. The ratio of the surface area of the base surface to the surface area of the plurality of integral features is greater than 0. In one or more embodiments, ratio of the surface area of the base surface to the surface area of the plurality of integral features is greater than 0 and less than or equal to 0.5, and all values and subranges therebetween.

Figure 3:
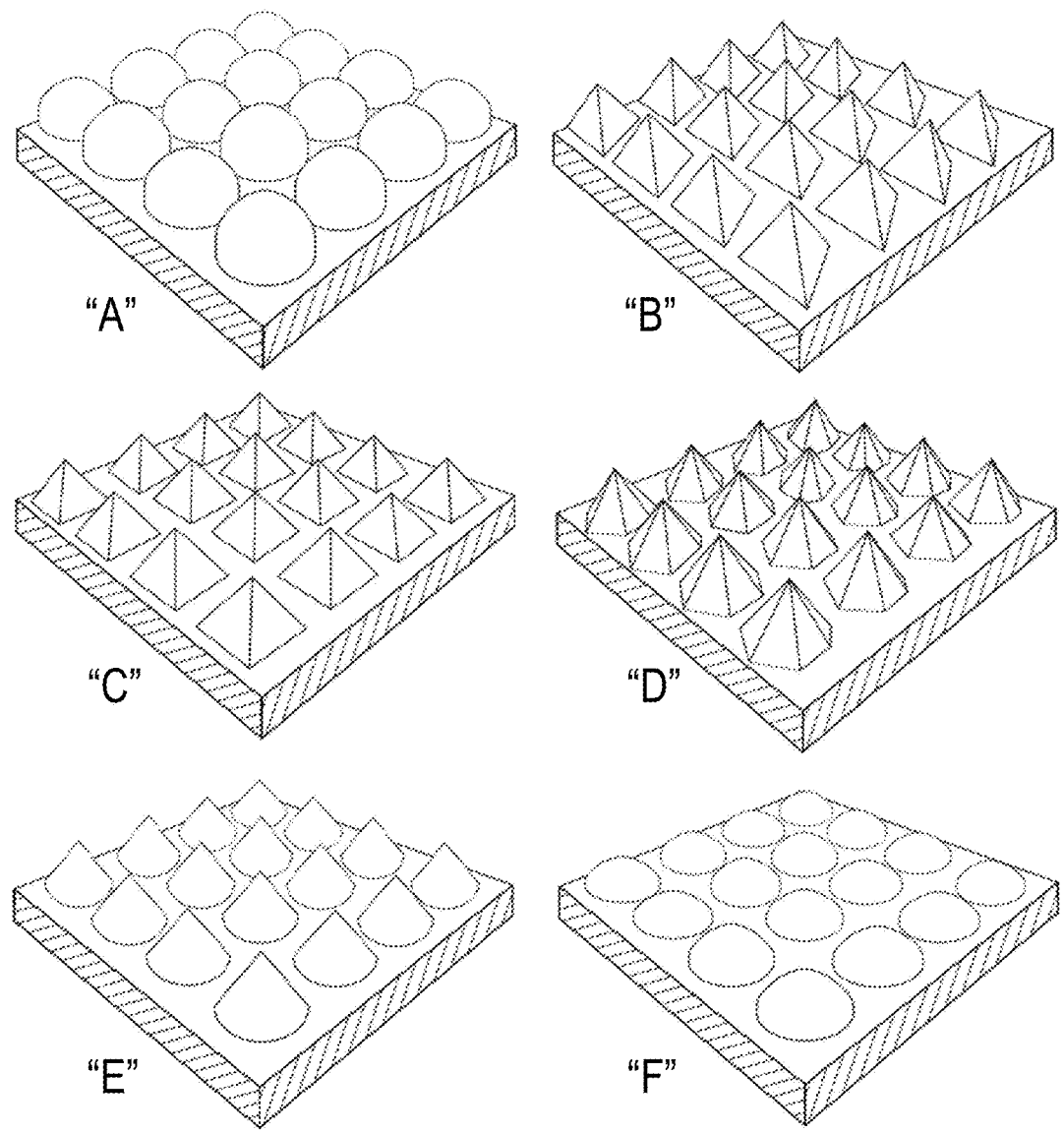
FIG. 3 illustrates various patterned substrates according to embodiments.

FIG. 3 illustrates various patterned substrates according to embodiments. For example, "A" depicts a hemispherical shape, "B" depicts a triangular pyramidal shape, "C" depicts a quadrangular pyramidal shape, "D" depicts a hexagonal pyramid shape, "E" depicts a conical shape, and "F" depicts a semi-spherical shape. Any of the patterns of FIG. 3 may be truncated, depending on the application.

Advantageously, the array patterns herein can have a smaller array pitch than could previously be used in state-of-the-art PSS fabrication. Pitch is the distance between centers of two elements. Typical array pitches are approximately 3.5 micrometers. Embodiments herein may utilize patterns wherein the pitch is less than 3.5 micrometers, for example greater than or equal to 0.5 micrometer to less than or equal to 3 micrometers, and all values and subranges therebetween.

In some cases, the aperture of the array patterns may also be smaller than used in state-of-the-art PSS fabrication.

The substrate may be any substrate known to one of skill in the art. In one or more embodiments, the substrate comprises one or more of sapphire, silicon carbide, silica (Si), silicon oxide ($SiO_2$), quartz, magnesium oxide (MgO), zinc oxide (ZnO), spinel, and the like.

A non-limiting exemplary method of making a patterned substrate is as follows. A masking film is coated onto a substrate wafer by any suitable thin film deposition method. In one or more embodiments, the substrate wafer is planar. The material of the masking film has sufficient etch selectivity versus the wafer. For example, the masking film may comprise $SiO_2$, which is coated onto a c-plane sapphire wafer by plasma-enhanced chemical vapor deposition (PECVD). This film forms a hard mask on the wafer. An array pattern of holes, for example, hexagonal openings, is etched through the masking film via standard photolithography and dry etching. Thereafter, the wafer is etched. Etching may be conducted by known wet etching methods or dry etching methods. For example, in a wet etching method, the wafer is placed in a bath of hot acid, for example, phosphoric acid, which etches sapphire wafer much faster than the masking film. Due to the different etch rates of sapphire in different crystallographic directions, the end result of this acid etch is an array of protruding integral features, for example, truncated triangular pyramids, with the masking film covering the flat tops of the, for example, pyramids. The height and widths of the pyramids are controlled by etch rate and etch time. The array pitch is determined from the pitch of the array pattern. Upon completion of the protruding integral features by etch, the masking film is selectively removed by etching in, for example, dilute HF.

At operation 104, optionally, a nucleation layer 204 is deposited on the patterned substrate 200a to form a first intermediate substrate 200b. The nucleation layer 204, when present, is a conformal layer, and covers surfaces of the integral features 202 and the base surface 203 in their entireties.

In one or more embodiments, the nucleation layer 204 comprises a nucleation material. In some embodiments, the nucleation material comprises: aluminum nitride (AlN), gallium nitride (GaN), aluminum gallium nitride (AlGaN), zinc oxide (ZnO), or combinations thereof. In one or more specific embodiments, the nucleation layer 204 comprises aluminum nitride (AlN).

A non-limiting exemplary method of depositing a nucleation layer is as follows. The patterned substrate 200a is loaded into a deposition chamber and a conformal nucleation layer 204 is deposited by any suitable thin film deposition method for form the first intermediate substrate 200b. In one or more embodiments, the conformal nucleation layer is deposited by reactive sputtering onto the intermediate substrate that is placed in a sputtering deposition chamber. Although both operations of depositing the nucleation layer and depositing the selective layer, which will be presented next, involve sputtering, the process conditions and/or equipment used for depositing the nucleation layer are typically different from those for depositing the selective layer.

At operation 106, a selective layer 208 is created on the first intermediate substrate 200b to form a selective layer-coated substrate (also referred to as a second intermediate substrate) 200c. The selective layer 208 is on surfaces of the integral features 202 with an optional intervening nucleation layer. There is an absence of the selective layer 208 on the base surface 203, and on the optional nucleation layer when present, as identified by locations 205a, 205b, and 205c. In one or more embodiments, the selective layer is located on at least a portion of surfaces of the integral features. In a preferred embodiment, the selective layer is located on all portions of surfaces of the integral features. In one or more embodiments, the absence of the selective layer is for at least a portion of surfaces of the integral features. In a preferred embodiment, the absence of the selective layer is for all portions of the base surface.

In one or more embodiments, the selective layer 208 comprises a dielectric material. The dielectric material can be any material compatible with subsequent selective etching processes and III-nitride material epitaxial growth processes. In some embodiments, the dielectric material comprises a low refractive index material having a refractive index in a range of about 1.2 to about 2. In one or more embodiments, the dielectric material comprises: silicon dioxide, ($SiO_2$), silicon nitride ($Si_3N_4$), or combinations thereof. In one or more embodiments, the selective layer has a thickness in a range of 20 nm to 400 nm, including all values and subranges therebetween, including 20 nm to 200 nm. In a preferred embodiment, the selective layer is conformal to the pattern of integral features. In one or more embodiments, the selective layer thickness is larger than, for example wavelength/4. In an embodiment, the selective layer is conformal to the pattern of integral features and the selective layer has a thickness of larger than wavelength/4.

One non-limiting exemplary method of creating a selective layer is as follows. The first intermediate substrate 200b is loaded into a deposition chamber and a selective layer is deposited by a suitable thin film deposition method that is preferably a directional deposition methods. In one or more embodiments, the selective layer is deposited by reactive sputtering onto the intermediate substrate that is placed in a sputtering deposition chamber to form the selective layer-coated substrate (also referred to as the second intermediate substrate) 200c. The process conditions and/or equipment used for depositing the selective layer differ as compared to depositing the nucleation layer in that directional deposition for the selective layer is preferred. For example, the first intermediate substrate 200b is loaded into a sputtering deposition chamber equipped with a dielectric target, for example, a $SiO_2$ target, oriented at a 30-degree angle with respect to the surface normal of the intermediate substrate. Due to the self-shadowing effect from the integral features protruding from the body of the substrate, the $SiO_2$ coating deposited is thickest at the tops of the integral features and thinnest at the base surface between the integral features. Thereafter, an etching operation is selected to remove any dielectric material from the base surface and to provide desired final thickness of the selective layer. For the etching operation, the second intermediate substrate is etched, for example wet-etched, with a chemistry which slowly etches the dielectric material deposited but does not etch the substrate material, e.g., sapphire, or the nucleation layer. For example a dilute HF solution is suitable when the dielectric material is $SiO_2$. The etching time is chosen such that all of the dielectric material on the base surface is removed while some dielectric material remains on the surfaces of the integral features. The thickness of the remaining selective layer is preferably greater than or equal to 20 and less than or equal to 200 nm. It is understood that the thickness may have some variation from tops to bottoms of the integral features.

Another non-limiting exemplary method of creating a selective layer is as follows. The first intermediate substrate 200b is loaded into a deposition chamber and a selective layer is deposited by any thin film deposition method. In one or more embodiments, the selective layer is deposited by reactive sputtering onto the intermediate substrate that is placed in a sputtering deposition chamber to form the selective layer-coated substrate (also referred to as the second intermediate substrate) 200c. In this method, there is not a directional deposition. Rather, a conformal layer of dielectric material is deposited. Thereafter, a selective etching operation is selected to remove the dielectric material from the base surface.

Other non-limiting exemplary methods of creating a selective layer involve the use of masked lithographic methods such as nano-imprint, electron-beam, holographic, or conventional photolithography to pattern the dielectric layer on top of PSS features instead of mask-less patterning as discussed above. The thickness uniformity of the dielectric layer is inherently better with masked lithography, but masked lithography may be difficult to use for densely packed patterns of features with large aspect ratios.

At operation 108, a III-nitride layer 212 is grown on the selective layer-coated substrate (also referred to as the second intermediate substrate) 200c to form a third intermediate substrate 200d. The III-nitride layer 212 is grown on surfaces of the selective layer-coated substrate 200c.

In one or more embodiments, the III-nitride layer 212 comprises a III-nitride material. In one or more embodiments, the III-nitride material comprises: gallium (Ga), aluminum (Al), indium (In), or combinations thereof. Thus, in some embodiments, the III-nitride layer 212 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In one or more specific embodiments, the III-nitride layer 212 comprises gallium nitride. In a specific embodiment, the nucleation layer 204 comprises aluminum nitride (AlN) and the III-nitride layer 212 comprises gallium nitride (GaN).

One non-limiting exemplary method of growing the III-nitride layer is as follows. The selective layer-coated substrate 200c is placed in a metalorganic vapor-phase epitaxy (MOVPE) reactor for growth of the III-nitride and formation of the LED device 200e. This step may use either standard MOVPE growth conditions or conditions that were specifically optimized for growth on the dielectric-coated dense PSS patterns described herein. The first part of this MOVPE growth is typically a high temperature GaN growth step with an optional nucleation layer (AlN), thus minimizing or eliminating any GaN nucleation directly on the dielectric mask.

An embodiment of a light emitting diode (LED) device comprises: a patterned substrate comprising a substrate body, a plurality of integral features protruding from the substrate body, and a base surface defined by spaces between the plurality of integral features; a selective layer comprising a dielectric material located on the surfaces of the integral features, wherein there is an absence of the selective layer on the base surface; and a III-nitride layer comprising a III-nitride material on the selective layer and the base surface.

A detailed embodiment of a light emitting diode (LED) device comprises: a patterned sapphire substrate comprising a substrate body, a plurality of integral features protruding from the substrate body, and a base surface defined by spaces between the plurality of integral features; a conformal nucleation layer on the surfaces of the integral features and on the base surface; a selective layer on the conformal nucleation layer, the selective layer comprising a dielectric material of silicon dioxide located above the integral features, wherein there is an absence of the selective layer above the base surface, the selective layer having a thickness in a range of 20 nm to 200 nm; and a III-nitride layer comprising a gallium nitride (GaN) material on the selective layer and the base surface.

The LED device of one of more embodiments is useful in any product known to one of skill in the art which uses a side-coated chip-scale package (CSP) architecture. As used herein, the term "chip-scale package (CSP)" refers to a type of integrated circuit package. In one or more embodiments, a chip-scale package is provided which has an area no greater than about 1.2 times that of the die, which is a single-die, direct surface mountable package. In one or more embodiments, the CSP has a ball pitch that is less than or equal to about 1 mm. FIG. 6 is a cross-section view of an exemplary LED package 700 according to one or more embodiments. Referring to FIG. 6, a chip-scale package (CSP) LED unit 700 comprising the LED device 702 of one or more embodiments. An anode 704 and a cathode 706 are soldered to the LED device 702.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Various embodiments will be further clarified by the following examples.

Example 1

Analysis of flux gains was conducted by an optical modeling method as follows. The optical modeling methods conducted for Example 1 used an industry-qualified MonteCarlo-based ray-trace optical simulator to predict optical behavior of designed light emitting diode (LED) devices.

Figure 4:
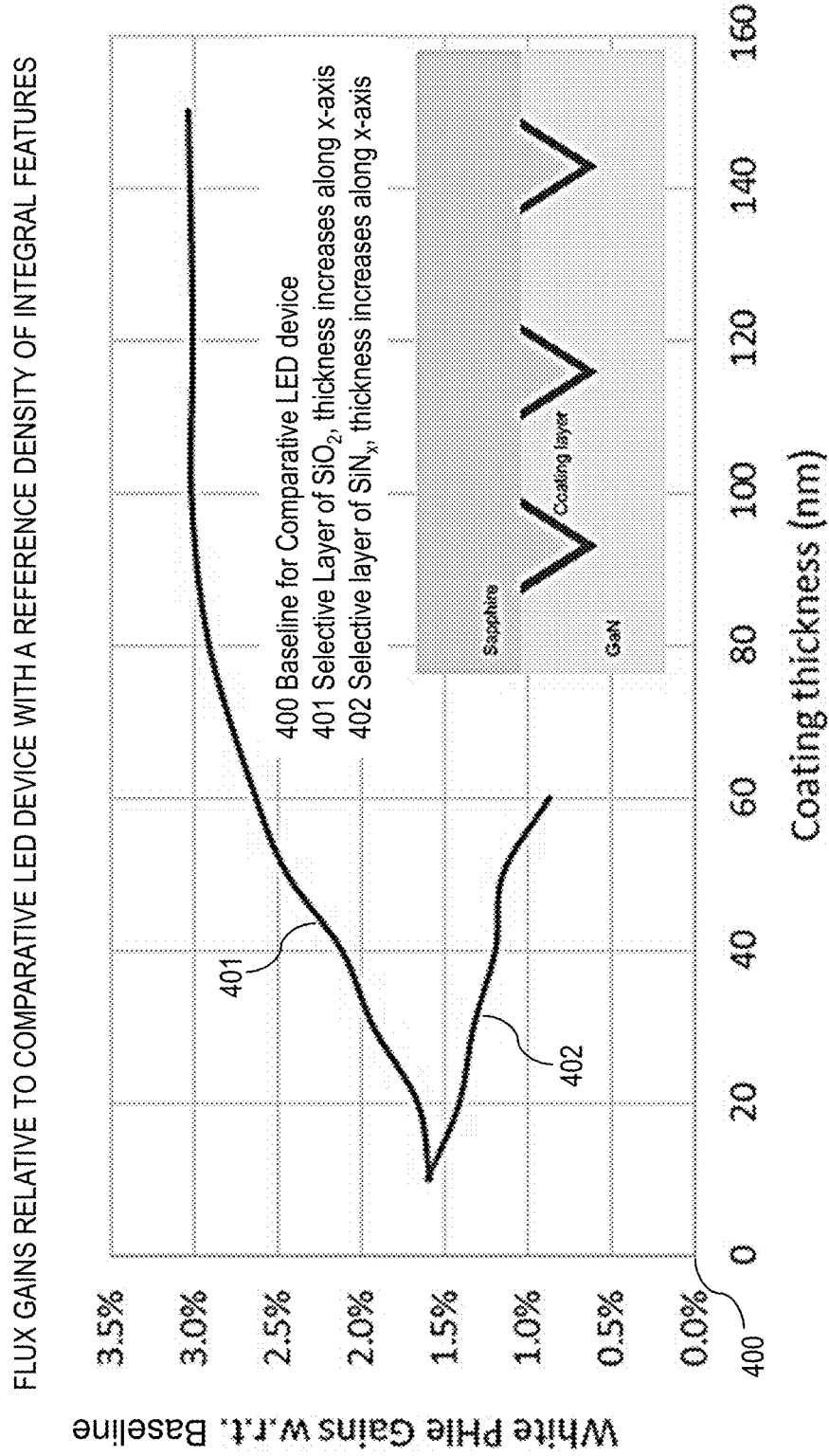
FIG. 4 provides a plot of flux gain in percentage versus coating thickness (nm)

FIG. 4 provides a plot of flux gain in percentage versus coating thickness (nm).

A comparative LED device comprised: a GaN epitaxial layer on a sapphire substrate, where having a plurality of integral features were present at a reference density. For the purposes of Example 1, a flux gain of this comparative LED device was 0, which is identified as "400" in FIG. 4.

For a first comparison, thickness of a selective $SiO_2$ layer at a constant density of integral features was increased along the x-axis, which is identified as "401" in FIG. 4. An increase in thickness showed an increase in flux gain starting at more than 1.5% with a leveling off at 3.0% relative to the comparative LED device.

For a second comparison, thickness of a selective layer of $SiN_x$ at a constant density of integral features was increased along the x-axis, which is identified as "402" in FIG. 4. An increase in flux gain was about 0.9% at a coating thickness of 60 nm and more than 1.5% at a coating thickness of 10 nm, and values therebetween, relative to the comparative LED device.

Example 2

Analysis of forward gain was conducted by obtaining radiation information from the optical modeling methods used in Example 1 and calculating forward gain according to the following formula (A):

Fwd Gain $(\theta c) = \int_0^{\theta c} I(\theta) \cdot \sin(\theta) d\theta / \int_0^{\theta\ max} I(\theta) \cdot \sin(\theta) d\theta$     (A), where I is radiant intensity; θ is scatter angle (0 degrees at normal with respect to emitter surface); θ max is 90 degrees, which is the horizon scatter angle; θc is the scatter angle cut off, which is less than 90 degrees, for example, 45 degrees.

Figure 5:
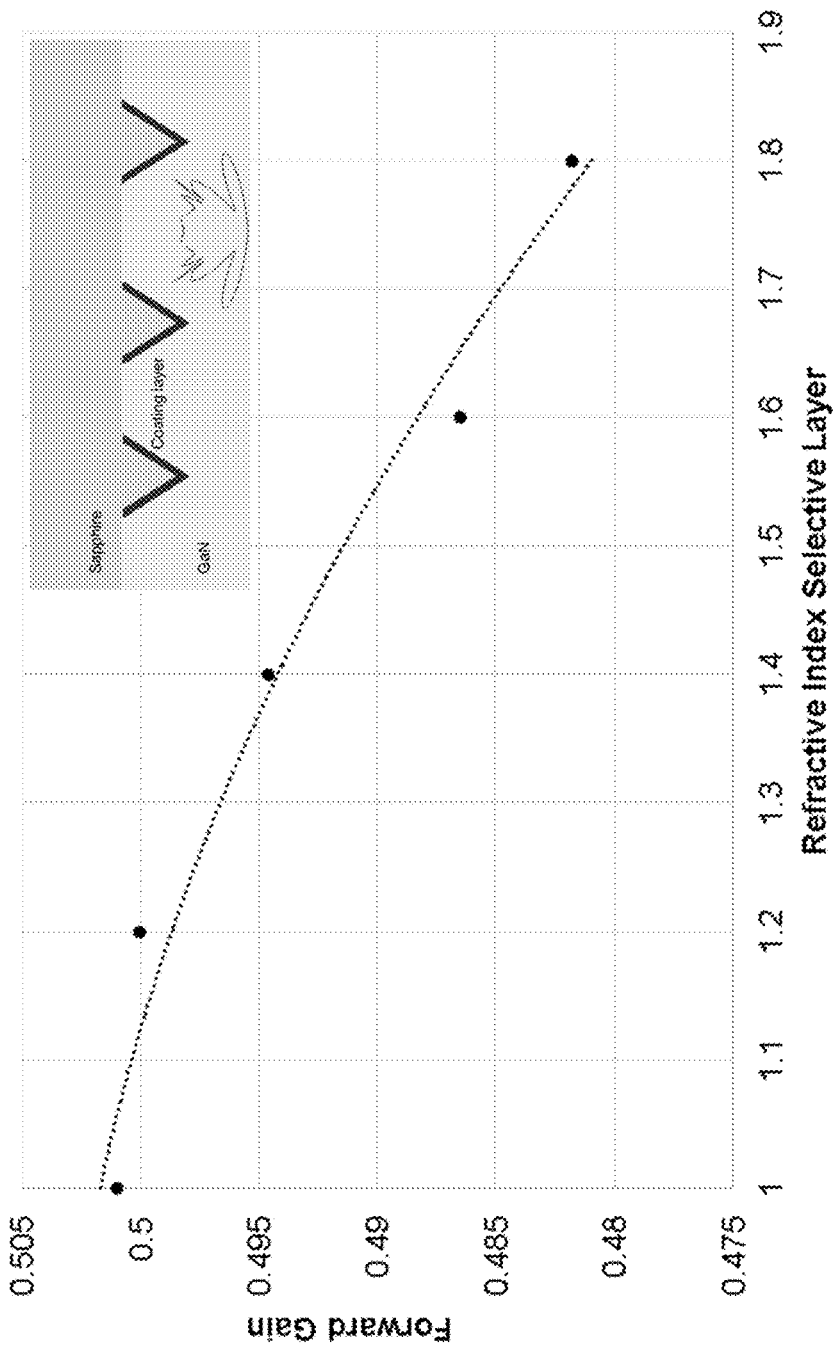
FIG. 5 provides a plot of forward gain versus refractive index of selective layer.

FIG. 5 provides a plot of forward gain versus refractive index of selective layer. Forward gain defines the amount of radiation contained within a 45 degree cone angle normal to the LES (Light Escape Surface). It amounts to 0.5 for a Lambertian emission. Angular emission of first pass transmission becomes more forward directed as the refractive index of the coating layer decreases. This impacts chip-sale package losses as pump light interacts less with side-coat reflective material.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:
1. A light emitting diode (LED) device comprising:
   a patterned substrate comprising a substrate body, a plurality of integral features protruding from the substrate body, and a base surface defined by spaces between the plurality of integral features;
   a conformal nucleation layer comprising a nucleation material directly on the plurality of integral features and directly on the base surface, the nucleation material comprising one or more of aluminum nitride (AlN), gallium nitride (GaN), and aluminum gallium nitride (AlGaN);
   a selective layer comprising a dielectric material located on the nucleation layer, wherein there is an absence of the selective layer on the nucleation layer on the base surface in the spaces between the plurality of integral features; and a III-nitride layer comprising a III-nitride material on the selective layer and directly on the nucleation layer on the base surface in the spaces between the plurality of integral features.

2. The LED device of claim 1, wherein the selective layer is located on all portions of surfaces of the integral features.

3. The LED device of claim 1, wherein the absence of the selective layer is for all portions of the base surface.

4. The LED device of claim 1, wherein the III-nitride material comprises: gallium (Ga), aluminum (Al), indium (In), or combinations thereof.

5. The LED device of claim 1, wherein the dielectric material comprises a low refractive index material having a refractive index in a range of about 1.2 to about 2.

6. The LED device of claim 5, wherein the dielectric material comprises: silicon dioxide, ($SiO_2$), silicon nitride ($Si_3N_4$), or combinations thereof.

7. The LED device of claim 1, wherein the selective layer has a thickness in a range of 20 nm to 400 nm.

8. The LED device of claim 1, wherein the plurality of integral features has a shape selected from: a hemispherical shape, a triangular pyramidal shape, a quadrangular pyramidal shape, a hexagonal pyramid shape, a conical shape, a semi-spherical shape, and a cut-spherical shape.

9. The LED device of claim 1, wherein the substrate comprises a material of: sapphire, spinel, zinc oxide (ZnO), magnesium oxide (MgO), or combinations thereof.

10. A light emitting diode (LED) device comprising:
a patterned sapphire substrate comprising a substrate body, a plurality of integral features protruding from the substrate body, and a base surface defined by spaces between the plurality of integral features;
a conformal nucleation layer directly on the surfaces of the integral features and directly on the base surface, the conformal nucleation layer comprising one or more of aluminum nitride (AlN), gallium nitride (GaN), and aluminum gallium nitride (AlGaN);
a selective layer on the conformal nucleation layer, the selective layer comprising a dielectric material of silicon dioxide located above the integral features, wherein there is an absence of the selective layer above the base surface, the selective layer having a thickness in a range of 20 nm to 200 nm; and
a III-nitride layer comprising a gallium nitride (GaN) material on the selective layer and the base surface.

11. The LED device of claim 10, wherein the selective layer is located on all portions of surfaces of the integral features.

12. The LED device of claim 10, wherein the absence of the selective layer is for all portions of the base surface.

13. A method of manufacturing comprising:
depositing a nucleation layer directly onto a patterned substrate that comprises: a substrate body, a plurality of integral features protruding from the substrate body, and a base surface defined by spaces between the plurality of integral features, the nucleation layer comprising one or more of aluminum nitride (AlN), gallium nitride (GaN), and aluminum gallium nitride (AlGaN);
creating a selective layer comprising a dielectric material on the patterned substrate, the selective layer located on surfaces of the plurality of integral features, wherein there is an absence of the selective layer on the base surface thereby making a selective layer-coated substrate; and
epitaxially growing a III-nitride layer on the selective layer-coated substrate.

14. The method of claim 13, wherein the selective layer is created by depositing the dielectric material onto the patterned substrate by a directional deposition process that is selective to deposition on the surfaces of the plurality of integral features; and thereafter etching to remove any dielectric material from the base surface.

15. The method of claim 13, wherein the selective layer is created by depositing the dielectric material onto the patterned substrate by: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), or combinations thereof; and thereafter selectively etching the dielectric material from the base surface preferentially over the surfaces of the integral features.

16. The method of claim 13, wherein the selective layer is on all portions of surfaces of the integral features.

17. The method of claim 13, wherein the absence of the selective layer is for all portions of the base surface.

* * * * *